United States Patent
Oga et al.

(10) Patent No.: US 12,424,710 B2
(45) Date of Patent: Sep. 23, 2025

(54) BUSBAR MODULE

(71) Applicant: Yazaki Corporation, Tokyo (JP)

(72) Inventors: Tatsuya Oga, Shizuoka (JP); Hirotaka Mukasa, Shizuoka (JP); Kazuhiko Tsuchiya, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 611 days.

(21) Appl. No.: 17/862,583

(22) Filed: Jul. 12, 2022

(65) Prior Publication Data

US 2023/0014903 A1 Jan. 19, 2023

(30) Foreign Application Priority Data

Jul. 15, 2021 (JP) ................................. 2021-116794

(51) Int. Cl.
  *H01M 50/519* (2021.01)
  *H01M 50/507* (2021.01)
  *H05K 1/02* (2006.01)

(52) U.S. Cl.
  CPC ....... *H01M 50/519* (2021.01); *H01M 50/507* (2021.01); *H05K 1/0283* (2013.01); *H01M 2220/20* (2013.01); *H05K 2201/052* (2013.01); *H05K 2201/09063* (2013.01)

(58) Field of Classification Search
  CPC . H05K 1/0283; H01M 50/507; H01M 50/569
  See application file for complete search history.

(56) References Cited

U.S. PATENT DOCUMENTS

| 11,239,533 B2 | 2/2022 | Zeng et al. |
| 2019/0181418 A1* | 6/2019 | Son ..................... H01M 50/569 |
| 2020/0395590 A1 | 12/2020 | Yasuda et al. |
| 2021/0226260 A1 | 7/2021 | Moon et al. |
| 2022/0077536 A1* | 3/2022 | Yamada .............. H01M 50/505 |

(Continued)

FOREIGN PATENT DOCUMENTS

| CN | 210467964 U | 5/2020 |
| CN | 112103460 A | 12/2020 |
| EP | 3 754 753 A1 | 12/2020 |

(Continued)

OTHER PUBLICATIONS

WO2020195845 A1 Machine Translation (Year: 2020).*

*Primary Examiner* — Mark Ruthkosky
*Assistant Examiner* — Sarah J Jacobson
(74) *Attorney, Agent, or Firm* — Sughrue Mion, PLLC

(57) ABSTRACT

A busbar module includes: a plurality of busbars arranged along a first direction and connected to battery cells; and a plate-like circuit body having a plurality of detection lines to be connected to the busbars and having flexibility, in which the circuit body includes a main line portion in which the plurality of detection lines is routed and branch portions, branching from the main line portion and in which the detection lines to be connected to the busbars are routed, the branch portions each include a stretchable portion that is stretchable along the first direction, the stretchable portions each have slits or a cutout formed in a direction intersecting the first direction in a plan view of the circuit body, and a detection line of each of the stretchable portions is routed along the slits or the cutout.

2 Claims, 6 Drawing Sheets

(56) References Cited

U.S. PATENT DOCUMENTS

2022/0102814 A1   3/2022   Chen et al.
2023/0378551 A1   11/2023  Moon et al.

FOREIGN PATENT DOCUMENTS

| JP | 06-140727 A | 5/1994 |
| JP | 2015-138604 A | 7/2015 |
| JP | 2019-023996 A | 2/2019 |
| JP | 2020-202060 A | 12/2020 |
| KR | 10-2019-0130929 A | 11/2019 |
| WO | WO-2020195845 A1 * | 10/2020 |
| WO | 2021/057211 A1 | 4/2021 |

* cited by examiner

BUSBAR MODULE

CROSS-REFERENCE TO RELATED APPLICATION(S)

The present application claims priority to and incorporates by reference the entire contents of Japanese Patent Application No. 2021-116794 filed in Japan on Jul. 15, 2021.

BACKGROUND OF THE INVENTION

1. Field of the Invention

The present invention relates to a busbar module.

2. Description of the Related Art

Conventionally, there are busbar modules. Japanese Patent Application No. 2019-23996 A discloses a battery connection module including a flexible circuit board including a body and a plurality of L-shaped flexible arms extending from the body. The L-shaped flexible arms of Japanese Patent Application No. 2019-23996 each include a first section which extends outwardly from the body toward a plurality of bus bars; a second section which connects with the first section and extends in a direction between the plurality of bus bars and the body; and an end portion which is positioned at a distal end of the second section and connects with a corresponding bus bar. Note that Japanese Patent Application No. H6-140727 discloses a flexible printed wiring board that does not receive a tensile force even in a case where there is a deviation in the position of an electric device or the like to be connected.

In busbar modules, it is desired to improve followability to busbars. For example, if it is possible to make a circuit body stretchable, followability when the circuit body is connected to a busbar is improved.

SUMMARY OF THE INVENTION

An object of the present invention is to provide a busbar module capable of improving followability to a busbar.

In order to achieve the above mentioned object, a busbar module according to one aspect of the present invention includes a plurality of busbars arranged along a first direction and connected to battery cells; and a plate-like circuit body having a plurality of detection lines to be connected to the busbars and having flexibility, wherein the circuit body includes a main line portion in which the plurality of the detection lines is routed and a branch portion branching from the main line portion, the branch portion in which one of the detection lines to be connected to one of the busbars is routed, the branch portion includes a stretchable portion that is stretchable along the first direction, the stretchable portion has a slit or a cutout formed in a direction intersecting the first direction in a plan view of the circuit body, and the detection line of the stretchable portion is routed along the slit or the cutout.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a busbar module according to an embodiment of the present invention will be described in detail with reference to the drawings. Note that the present invention is not limited by the embodiment. In addition, components in the following embodiment include those that can be easily conceived by those skilled in the art or those that are substantially the same.

Embodiment

Figure 1:
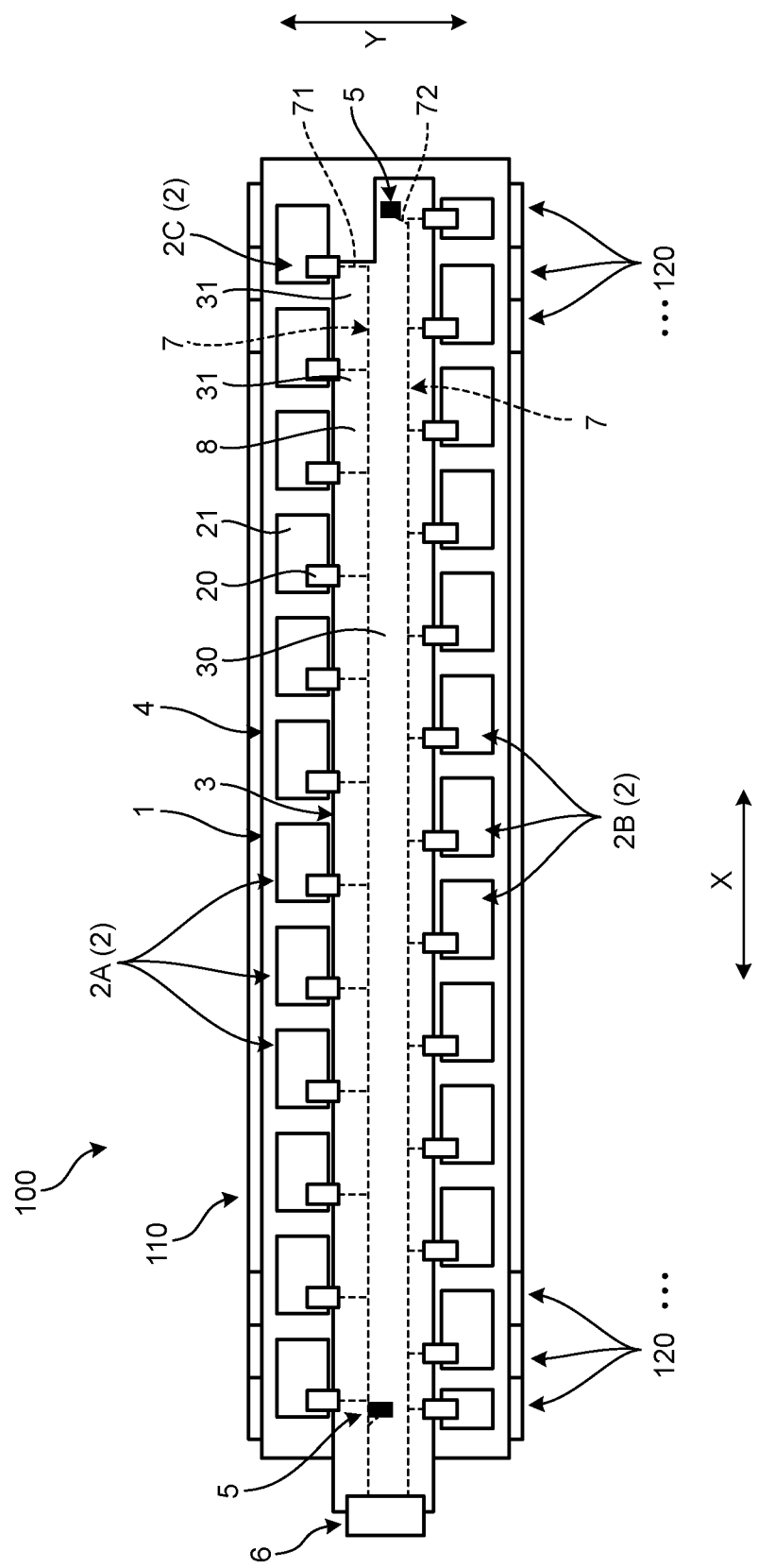
FIG. 1 is a plan view of a busbar module according to an embodiment.
Figure 2:
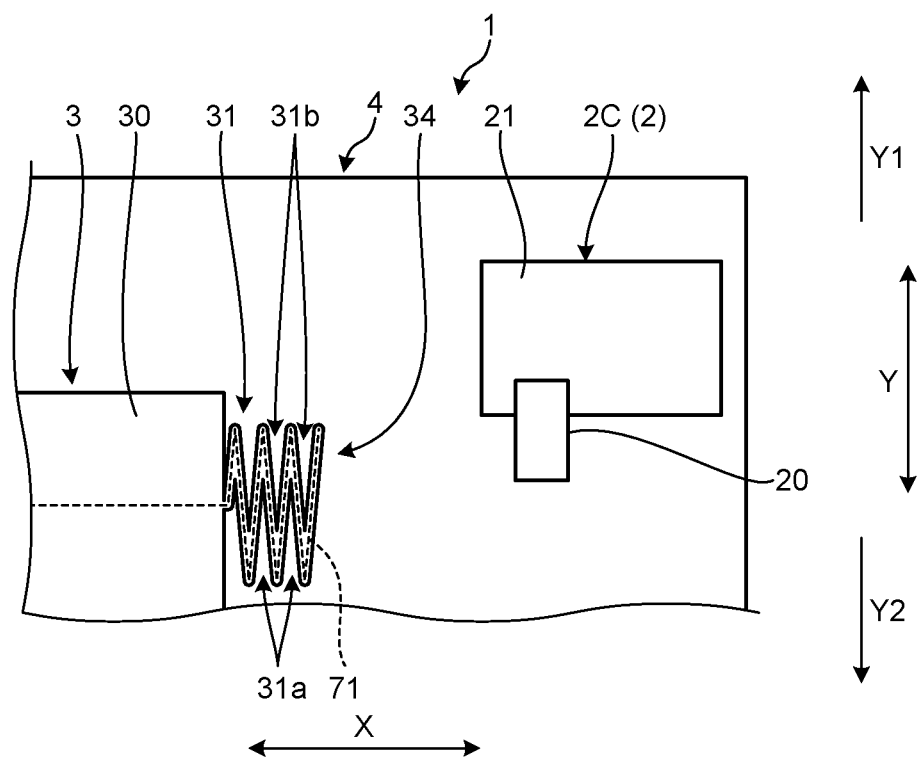
FIG. 2 is an enlarged view of the busbar module according to the embodiment.
Figure 3:
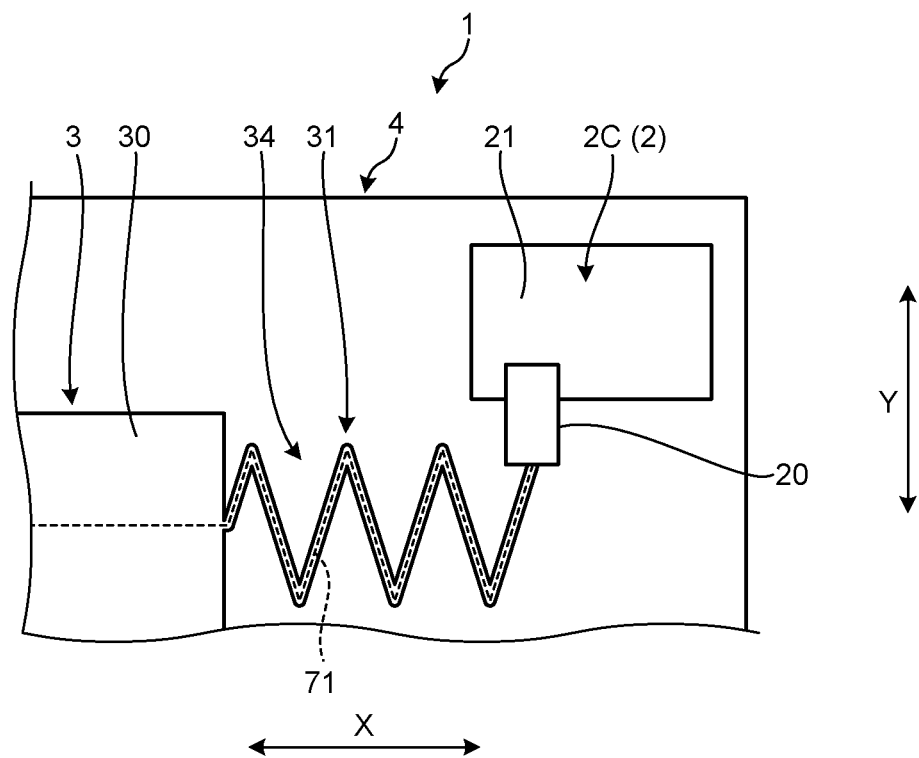
FIG. 3 is an enlarged view of the busbar module according to the embodiment.

An embodiment will be described with reference to FIGS. 1 to 7. The present embodiment relates to a busbar module. FIG. 1 is a plan view of a busbar module according to the embodiment, FIGS. 2 and 3 are enlarged views of the busbar module of the embodiment, and FIGS. 4 to 7 are plan views illustrating exemplary structures of a branch portion.

As illustrated in FIG. 1, a busbar module 1 of the embodiment includes a plurality of busbars 2, a circuit body 3, a case 4, thermistors 5, and a connector 6. The busbar module 1 is assembled to a battery module 110 to be included in a battery pack 100. The battery pack 100 is mounted as a power source on a vehicle such as an electric vehicle (EV), a hybrid electric vehicle (HEV), or a plug-in hybrid electric vehicle (PHEV). The battery pack 100 may include a plurality of busbar modules 1 and a plurality of battery modules 110.

The battery module 110 includes a plurality of battery cells 120. The battery cells 120 are arranged along a first direction X. A busbar 2 connects electrodes of two adjacent battery cells 120. The busbar module 1 connects, for example, the plurality of battery cells 120 in series by the busbars 2.

A busbar 2 is formed of a conductive metal plate such as copper or aluminum. A busbar 2 has a connection portion 20 and a terminal portion 21. The connection portion 20 is a portion connected to a voltage detection line. The terminal portion 21 is a portion connected to an electrode of a battery cell 120. The terminal portion 21 is fixed to the electrode by, for example, laser welding.

The busbar module 1 includes a first busbar group 2A and a second busbar group 2B. The first busbar group 2A and the second busbar group 2B each have a plurality of busbars 2 arranged along the first direction X. A busbar 2 of the first busbar group 2A is fixed to one electrode of a battery cell 120. A busbar 2 of the second busbar group 2B is fixed to another electrode of the battery cell 120.

In the following description, a direction orthogonal to the first direction X in a plan view of the busbar module 1 is referred to as a "second direction Y". The second direction Y is a width direction of the busbar module 1. A direction orthogonal to both the first direction X and the second direction Y is referred to as a "third direction Z". The third direction Z is a thickness direction of the busbar module 1.

The circuit body 3 is a circuit body of a plate shape and has flexibility. The circuit body 3 of the present embodiment is a flexible printed circuit (FPC) board. The circuit body 3 includes a main line portion 30 and a plurality of branch portions 31. The main line portion 30 is the main part of the circuit body 3 and has a rectangular shape in a plan view.

The circuit body 3 includes a plurality of detection lines 7 and a cover 8 covering the detection lines 7. The cover 8 is formed of, for example, flexible resin having insulating properties. A detection line 7 is formed of a metal foil such as a copper foil. The plurality of detection lines 7 includes voltage detection lines 71 and temperature detection lines 72. A voltage detection line 71 is a detection line connected to a busbar 2. A temperature detection line 72 is a detection line connected to a thermistor 5. The plurality of detection lines 7 is routed along the first direction X inside the main line portion 30.

A branch portion 31 is a portion branching from the main line portion 30 and connected to a busbar 2. One voltage detection line 71 connected to a busbar 2 is routed inside a branch portion 31.

A thermistor 5 is a detection element that detects the temperature of a battery cell 120. In the exemplified busbar module 1, thermistors 5 are arranged at both ends in the first direction X. The connector 6 is disposed at an end, in the first direction X, of the circuit body 3. The plurality of detection lines 7 is connected to terminals of the connector 6. The plurality of detection lines 7 is connected to a monitoring device via the connector 6. The monitoring device controls the battery pack 100 on the basis of detection values of the voltage and the temperature.

The case 4 houses and holds the plurality of busbars 2 and supports the circuit body 3. The case 4 is molded using, for example, insulating synthetic resin. The shape of the case 4 in a plan view is, for example, a rectangle.

Illustrated in FIGS. 2 and 3 are a busbar 2C located at an end of the first busbar group 2A and a branch portion 31 corresponding to the busbar 2C. The branch portions 31 of the embodiment are structured so as to be stretchable along the first direction X. The branch portion 31 includes a stretchable portion 34 that is stretchable along the first direction X. In the exemplified branch portion 31, the entire branch portion 31 is the stretchable portion 34. A voltage detection line 71 connected to the busbar 2C is routed inside the branch portion 31.

In the branch portion 31, a plurality of slits 31a extending in one side Y1 in the second direction Y and a plurality of slits 31b extending in another side Y2 in the second direction Y are formed. The plurality of slits 31a and the plurality of slits 31b are each arranged along the first direction X. Moreover, a slit 31a and a slit 31b are alternately arranged along the first direction X. That is, the branch portion 31 has an elongated zigzag shape due to the slits 31a and 31b.

The voltage detection line 71 is routed along the slits 31a and the slits 31b. That is, the voltage detection line 71 is routed in a zigzag shape inside the branch portion 31. The branch portion 31 houses the voltage detection line 71 therein so that the voltage detection line 71 is not exposed.

As illustrated in FIG. 3, the branch portion 31 is extended along the first direction X when connected to the busbar 2C. The voltage detection line 71 is reshaped along with the reshaping of the branch portion 31 and extends and contracts along the first direction X. The tip of the voltage detection line 71 is connected to the connection portion 20 of the busbar 2C. The voltage detection line 71 and the connection portion 20 are connected to each other by, for example, solder.

The branch portion 31 is structured so as to be stretchable along the first direction X in a state where the voltage detection line 71 is connected to the busbar 2C. That is, the branch portion 31 is formed so as to be connected to the busbar 2C in a stretchable state in a case where the busbar 2C is at a designed position. As a result, the branch portion 31 can absorb a tolerance in the first direction X and follow the positional deviation of the busbar 2C. The branch portion 31 in which the plurality of slits 31a and 31b is formed can be flexibly reshaped along the second direction Y and the third direction Z. That is, the branch portion 31 has flexibility to absorb the tolerance in the second direction Y and the third direction Z and follow a positional deviation of the busbar 2C. As described above, the busbar module 1 of the present embodiment can improve the followability to the busbars 2.

Figure 4:
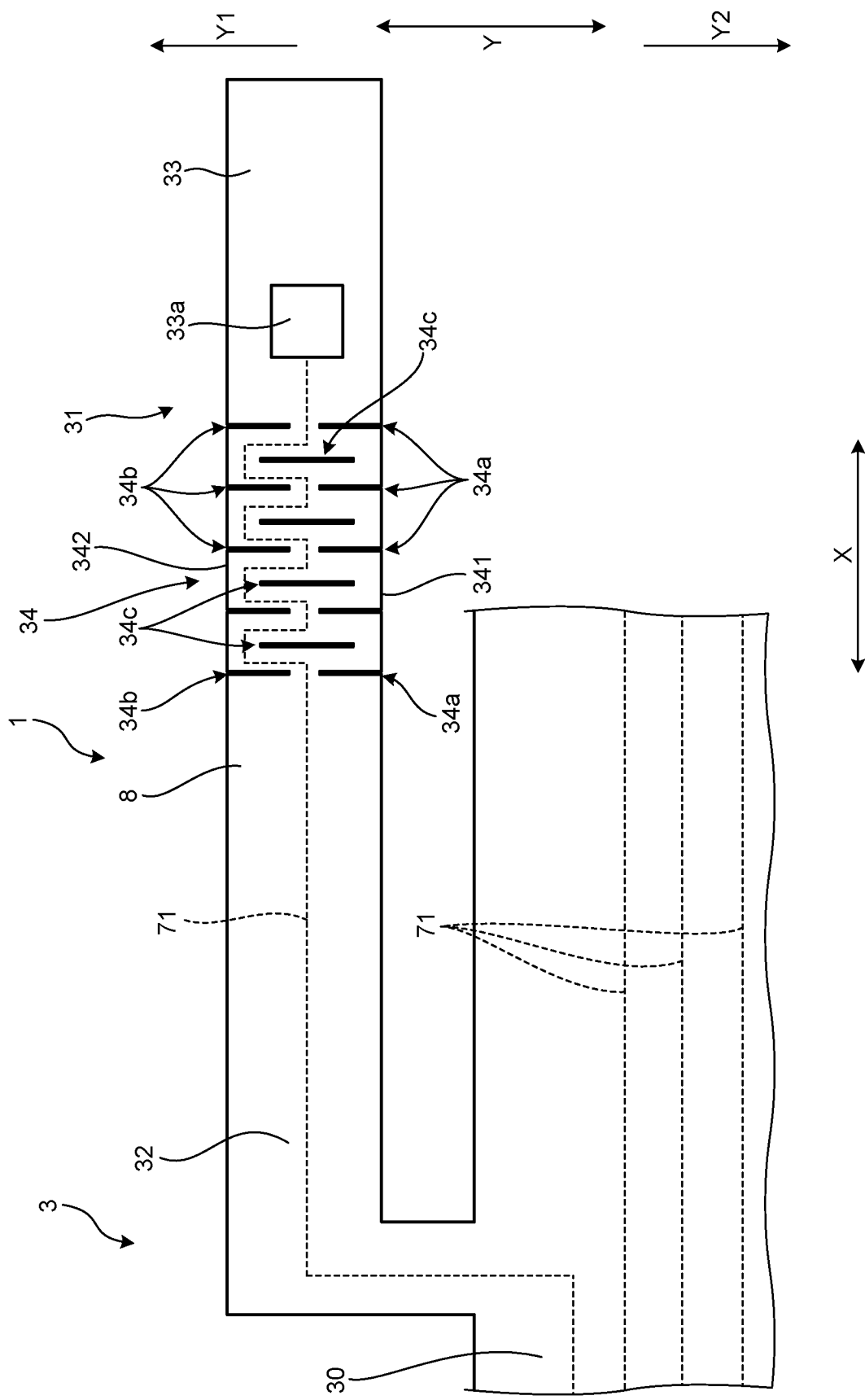
FIG. 4 is a plan view illustrating an exemplary structure of a branch portion.
Figure 5:
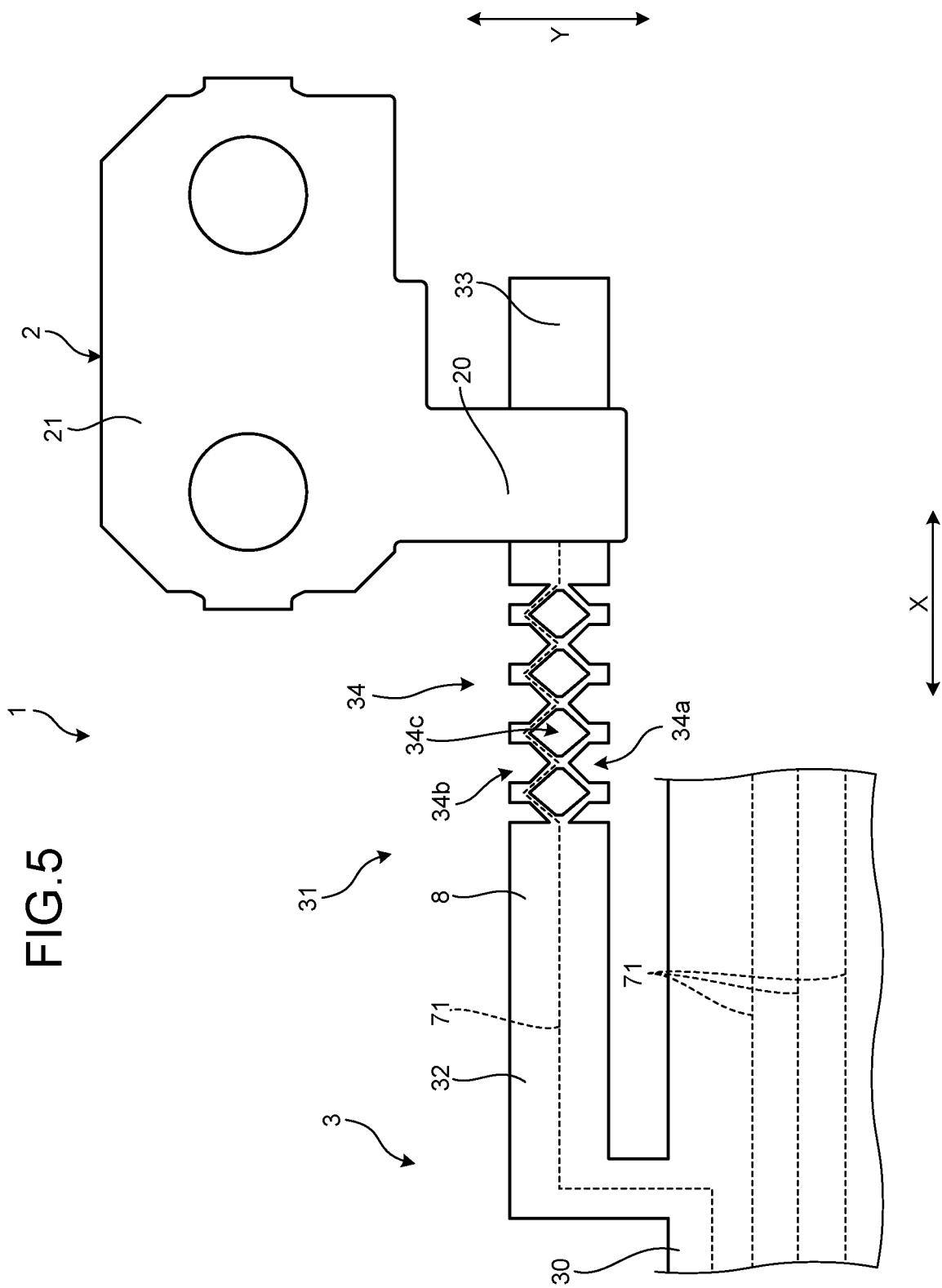
FIG. 5 is a plan view illustrating an exemplary structure of a branch portion.

Note that the branch portion 31 can have any shape that can extend and contract in the first direction X. In FIGS. 4 and 5, an example of a branch portion 31 that is stretchable is illustrated. As illustrated in FIG. 4, a branch portion 31 includes a base 32, a distal end 33, and a stretchable portion 34. The branch portion 31 has a substantially L-shape in a plan view.

The base 32 is a portion connected to the main line portion 30, and protrudes from the main line portion 30 in the second direction Y. The base 32 has a substantially L-shape in a plan view. The distal end 33 is a portion located at the distal end of the branch portion 31 and is connected to a busbar 2. The stretchable portion 34 is located between the base 32 and the distal end 33 and extends along the first direction X.

As illustrated in FIG. 4, the stretchable portion 34 has a first side 341, a second side 342, a plurality of first slits 34a, a plurality of second slits 34b, and a plurality of cuts 34c. A first slit 34a is a slit extending from the first side 341 toward one side Y1 in the second direction Y. A second slit 34b is a slit extending from the second side 342 toward the other side Y2 in the second direction Y. The first slits 34a and the second slits 34b face each other in the second direction Y.

The cuts 34c are formed in an area between the first side 341 and the second side 342 and penetrates the cover 8 along the third direction Z. A cut 34c extends along the second direction Y. A cut 34c is located between a pair of slits 34a and 34b and adjacent another pair of slits 34a and 34b. A voltage detection line 71 is routed along the second slits 34b and the cuts 34c. In other words, the voltage detection line 71 is routed while bypassing the second slits 34b and the cuts 34c.

A conductive plate 33a connected with the busbar 2 is arranged at the distal end 33. The plate 33a is exposed from the cover 8. The voltage detection line 71 is connected to the busbar 2 via the plate 33a.

As illustrated in FIG. 5, the stretchable portion 34 is extended in the first direction X when the branch portion 31 is connected to the busbar 2. The stretchable portion 34 extends along the first direction X with the widths of the slits 34a and 34b and the cuts 34c widened. On the other hand, the stretchable portion 34 contracts along the first direction X with the widths of the slits 34a and 34b and the cuts 34c narrowed. The voltage detection line 71 is reshaped along with the reshaping of the stretchable portion 34 and extends or contracts along the first direction X. The plate 33a of the distal end 33 is connected to a connection portion 20 of the busbar 2.

The stretchable portion 34 is structured so as to be stretchable along the first direction X in a state where the distal end 33 is connected to the busbar 2. That is, the branch portion 31 is formed so as to be connected to the busbar 2C in a state where the stretchable portion 34 is stretchable in a state where the busbar 2 is at a designed position. In addition, the stretchable portion 34 has flexibility to absorb tolerances in the second direction Y and the third direction Z and to follow the positional deviation of the busbar 2.

Figure 6:
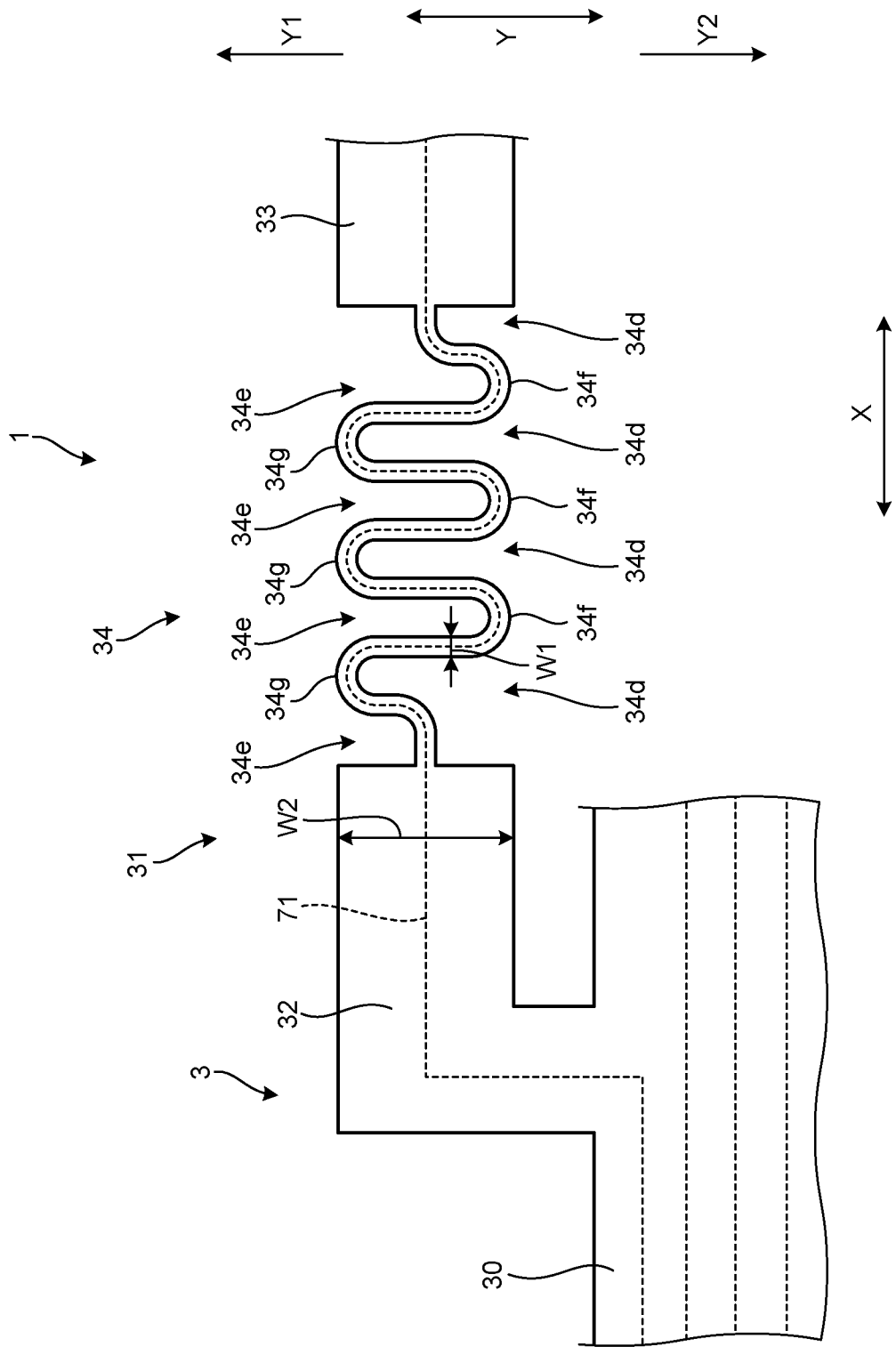
FIG. 6 is a plan view illustrating an exemplary structure of a branch portion.

In FIG. 6, another example of a branch portion 31 that is stretchable is illustrated. A branch portion 31 illustrated in FIG. 6 includes a base 32, a distal end 33, and a stretchable portion 34. The stretchable portion 34 has a meandering shape in a plan view. In the stretchable portion 34, a plurality of cutouts 34d extending in one side in the second direction Y and a plurality of cutouts 34e extending in the other side Y2 in the second direction Y are formed.

Arc portions 34f and 34g are formed by the cutouts 34d and 34e. An arc portion 34f has an arc shape extending toward the other side Y2 in the second direction Y in a plan view. An arc portion 34g has an arc shape extending toward the one side Y1 in the second direction Y in a plan view. In the stretchable portion 34, a portion between an arc portion 34f and an arc portion 34g extends along the second direction Y. A line width W1 of the stretchable portion 34 is sufficiently smaller than a width W2 of the base or the distal end 33.

The voltage detection line 71 is routed along the cutouts 34d and 34e. That is, the voltage detection line 71 has a meandering shape similar to the shape of the stretchable portion 34. The stretchable portion 34 and the voltage detection line 71 having a meandering shape are stretchable along the first direction X.

Figure 7:
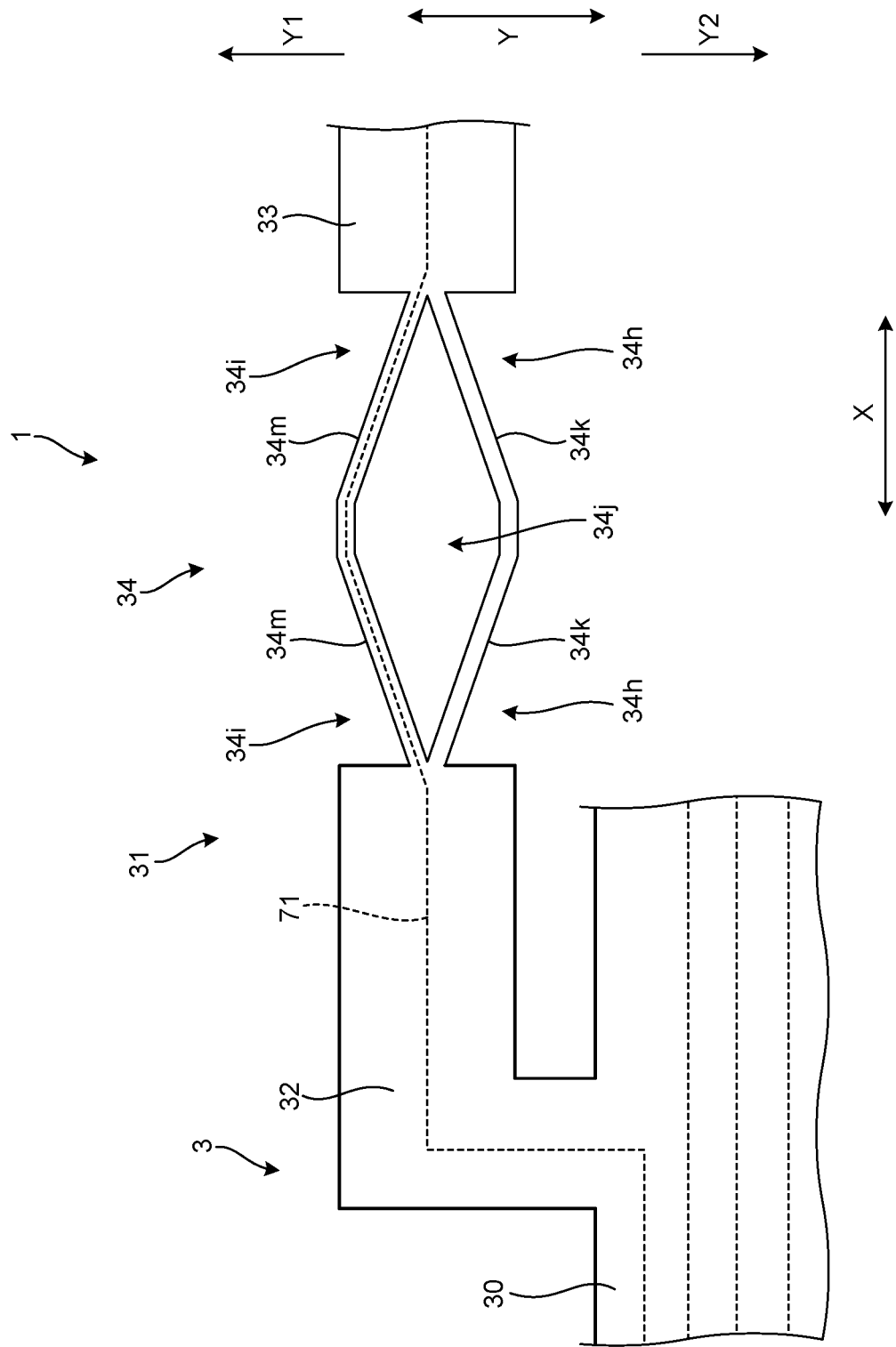
FIG. 7 is a plan view illustrating an exemplary structure of a branch portion.

In FIG. 7, another example of a branch portion 31 that is stretchable is illustrated. A branch portion 31 illustrated in FIG. 7 includes a base 32, a distal end 33, and a stretchable portion 34. The shape of the stretchable portion 34 in a plan view is substantially rhombic. Two cutouts 34h extending toward one side Y1 in the second direction Y, two cutouts 34i extending toward the other side Y2 in the second direction Y, and a cutout hole 34j are formed in the stretchable portion 34. The shape of the cutout hole 34j is substantially rhombic in a plan view. The cutout hole 34j penetrates the central portion of the stretchable portion 34 along the third direction Z.

A pair of oblique sides 34k and 34k is formed by the two cutouts 34h and the cutout hole 34j. The pair of oblique sides 34k and 34k is inclined with respect to the first direction X and is connected to each other. One oblique side 34k is connected to the base 32, and the other oblique side 34k is connected to the distal end 33.

A pair of oblique sides 34m and 34m is formed by the two cutouts 34i and the cutout hole 34j. The pair of oblique sides 34m and 34m is inclined with respect to the first direction X and is connected to each other. One oblique side 34m is connected to the base 32, and the other oblique side 34m is connected to the distal end 33.

The voltage detection line 71 is routed inside the pair of oblique sides 34m and 34m. That is, the voltage detection line 71 is routed along the cutouts 34i and the cutout hole 34j. The stretchable portion 34 having a rhombic shape is stretchable along the first direction X. Moreover, the voltage detection line 71 routed in the pair of oblique sides 34m and 34m is stretchable along the first direction X.

As described above, the busbar module 1 of the present embodiment includes the plurality of busbars 2 and the circuit body 3 having a plate shape and flexibility. The plurality of busbars 2 is arranged along the first direction X and connected to the battery cells 120. The circuit body 3 includes a plurality of detection lines 7 to be connected to the busbars 2. The circuit body 3 includes the main line portion 30 in which the plurality of detection lines 7 is routed and branch portions 31 branching from the main line portion 30. A detection line 7 to be connected to a busbar 2 is routed in a branch portion 31.

The branch portion 31 includes a stretchable portion 34 that is stretchable along the first direction X. The stretchable portion 34 has a slit or a cutout formed in a direction intersecting the first direction X in a plan view of the circuit body 3. The detection line 7 of the stretchable portion 34 is routed along the slit or the cutout. The busbar module 1 of the present embodiment can absorb the tolerance in the first direction X by the stretchable portion 34. Therefore, the busbar module 1 of the present embodiment can improve the followability to the busbars 2.

Note that the branch portions 31 can absorb tolerances in the second direction Y and the third direction Z by the flexibility of the circuit body 3. Moreover, the stretchable portions 34 formed to be stretchable can appropriately absorb tolerances in the second direction Y and the third direction Z.

The stretchable portions 34 can achieve both the height reduction of the busbar module 1 and the tolerance-absorbing function. As a comparative example, a busbar module that absorbs tolerance by making branch portions 31 bend in the third direction Z will be examined. In the busbar module of the comparative example, a housing space having an enough height in the third direction Z is required in order to house bent portions of the branch portions 31. On the other hand, in the busbar module 1 of the present embodiment, since the intersection in the first direction X can be absorbed without forming bent portions in the branch portions 31, the height of the busbar module 1 can be reduced.

The stretchable portion 34 illustrated in FIGS. 4 and 5 of the present embodiment has the plurality of slits extending in the second direction Y and the cuts 34c extending in the second direction Y. The plurality of slits includes the plurality of first slits 34a extending toward the one side Y1 in the second direction Y and the plurality of second slits 34b extending toward the other side Y2 in the second direction Y. The first slits 34a and the second slits 34b face each other in the second direction Y. A cut 34c is disposed between a pair of a first slit 34a and a second slit 34b and an adjacent pair of a first slit 34a and a second slit 34b.

According to the stretchable portion 34 formed by the plurality of slits 34a and 34b and the cuts 34c, it is possible to reduce the use area of the flexible printed circuit board. In other words, it is possible to minimize the area of the circuit body 3 in a state where the stretchable portions 34 contract the most.

The branch portions 31 of the present embodiment are structured to be connected to the busbars 2 while the stretchable portions 34 are stretched, for example. As an example, the branch portion 31 illustrated in FIG. 4 is structured so that the plate 33a can face the connection portion 20 of the busbar 2 by stretching the stretchable portion 34 in the first direction X. This makes it easy to cause the branch portion 31 to follow a busbar 2 without making the branch portion 31 bend.

Note that the circuit body 3 is not limited to a flexible printed circuit board. The circuit body 3 may include another circuit body having flexibility. For example, the circuit body 3 may include a flexible flat cable (FFC). In the circuit body 3, the detection lines 7 may be electric wires or may be formed by printing.

Modifications of Embodiment

The extendable length of the stretchable portions 34 may be different between the branch portion 31 located at the end in the first direction X and the other branch portions 31. For example, the maximum extension amount of the stretchable portion 34 located at the end may be set to be larger than that of the other stretchable portions 34. For example, in the busbar module 1 illustrated in FIG. 1, the maximum extension amount of the branch portion 31 corresponding to the busbar 2C may be larger than the maximum extension amount of the branch portions 31 corresponding to the other busbars 2 of the first busbar group 2A. As a result, the area of use of the flexible printed circuit board used by the circuit body 3 can be minimized.

The content disclosed in the above embodiment and the modifications can be implemented in combination as appropriate.

A stretchable portion of a busbar module according to the present embodiment has slits or cutouts formed in a direction intersecting a first direction and can extend and contract along the first direction. The busbar module according to the present invention has an effect of improving followability to a busbar.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A busbar module comprising:
  a plurality of busbars arranged along a first direction and connected to battery cells, wherein a second direction is a direction orthogonal to the first direction in a plan view of the busbar module; and
  a planar circuit body having a plurality of detection lines to be connected to the busbars and having flexibility, wherein
  the circuit body includes a main line portion in which the plurality of the detection lines is routed and a plurality of branch portions branching from the main line portion, wherein in each of the branch portions a voltage detection line among the detection lines to be connected to one of the busbars is routed,
  the branch portion includes a base having L-shape, connected to the main line portion and protruding from the main line portion in the second direction, a distal end located at the distal end of the branch portion and connectable to one of the busbars, and a stretchable portion located between the base and the distal end, and stretchable along the first direction,
  by having a plurality of slits and cuts formed in the branch portion in the second direction wherein
  the stretchable portion has the plurality of the slits extending in the second direction and a cut extending in the second direction,
  the plurality of the slits includes a plurality of first slits extending toward one side in the second direction and a plurality of second slits extending toward another side in the second direction,
  the first slits and the second slits face each other in the second direction, and
  the cut is disposed between a pair of one of the first slits and one of the second slits and adjacent another pair of one of the first slits and one of the second slits, and
  the voltage detection line is routed along the slits and cuts, and is housed in the branch portion.

2. The busbar module according to claim 1, wherein the branch portion is structured to be connected to the busbar while the stretchable portion is stretched.

* * * * *